US012567478B2

(12) United States Patent
Huang et al.

(10) Patent No.: US 12,567,478 B2
(45) Date of Patent: Mar. 3, 2026

(54) ERROR CONDITION MONITORING IN MEMORY SYSTEMS

(71) Applicants: SK hynix Inc., Icheon-si (KR); SK Hynix NAND Product Solutions Corp., Rancho Cordova, CA (US)

(72) Inventors: Pengfei Huang, San Jose, CA (US); Zion Kwok, Burnaby (CA); Fan Zhang, San Jose, CA (US)

(73) Assignees: SK HYNIX INC. (KR); SK HYNIX NAND PRODUCT SOLUTIONS CORP., Rancho Cordova, CA (US)

( * ) Notice: Subject to any disclaimer, the term of this patent is extended or adjusted under 35 U.S.C. 154(b) by 241 days.

(21) Appl. No.: 18/369,014

(22) Filed: Sep. 15, 2023

(65) Prior Publication Data

US 2025/0095765 A1      Mar. 20, 2025

(51) Int. Cl.
*G11C 29/52*      (2006.01)
*G11C 7/14*      (2006.01)
*G11C 29/00*      (2006.01)

(52) U.S. Cl.
CPC ................ *G11C 29/52* (2013.01); *G11C 7/14* (2013.01); *G11C 29/785* (2013.01)

(58) Field of Classification Search
CPC ......... G11C 29/52; G11C 7/14; G11C 29/785; G11C 29/42; G11C 2029/0411
See application file for complete search history.

(56) References Cited

U.S. PATENT DOCUMENTS

| | | |
|---|---|---|
| 2007/0011180 A1 | 1/2007 | Peretz et al. |
| 2008/0201540 A1 | 8/2008 | Sahita et al. |
| 2019/0188077 A1* | 6/2019 | Kwon ................. G06F 11/1072 |
| 2022/0156143 A1* | 5/2022 | Zamir ................. G06F 13/1668 |
| 2024/0086077 A1* | 3/2024 | Sanuki ................. G06F 3/0688 |

FOREIGN PATENT DOCUMENTS

| | | |
|---|---|---|
| CN | 111061591 A | 4/2020 |
| WO | WO2008083161 A1 | 7/2008 |

OTHER PUBLICATIONS

SK Hynix NAND Product Solutions Corp. (dba Solidigm), PCT/US2024/046486, International Search Report and Written Opinion, Dec. 23, 2024, 9 pgs.

* cited by examiner

*Primary Examiner* — Mohammed A Bashar
(74) *Attorney, Agent, or Firm* — Morgan, Lewis & Bockius LLP

(57) ABSTRACT

This application is directed to data validation in an electronic device having a memory device. The memory device receives an inquiry for a validity condition of a page of the memory device from a memory controller that is coupled to the memory device in a memory system. In response to the inquiry, the memory device selects a subset of the page of the memory device to represent the page. The subset of the page stores a set of memory data. The memory device obtains integrity data corresponding to the set of memory data, applies a plurality of validation operations on the set of memory data and the integrity data corresponding to the set of memory data to generate a plurality of validity results. The memory device determines an error parameter of the page locally based on the plurality of validity results and provides the error parameter to the memory controller.

20 Claims, 7 Drawing Sheets

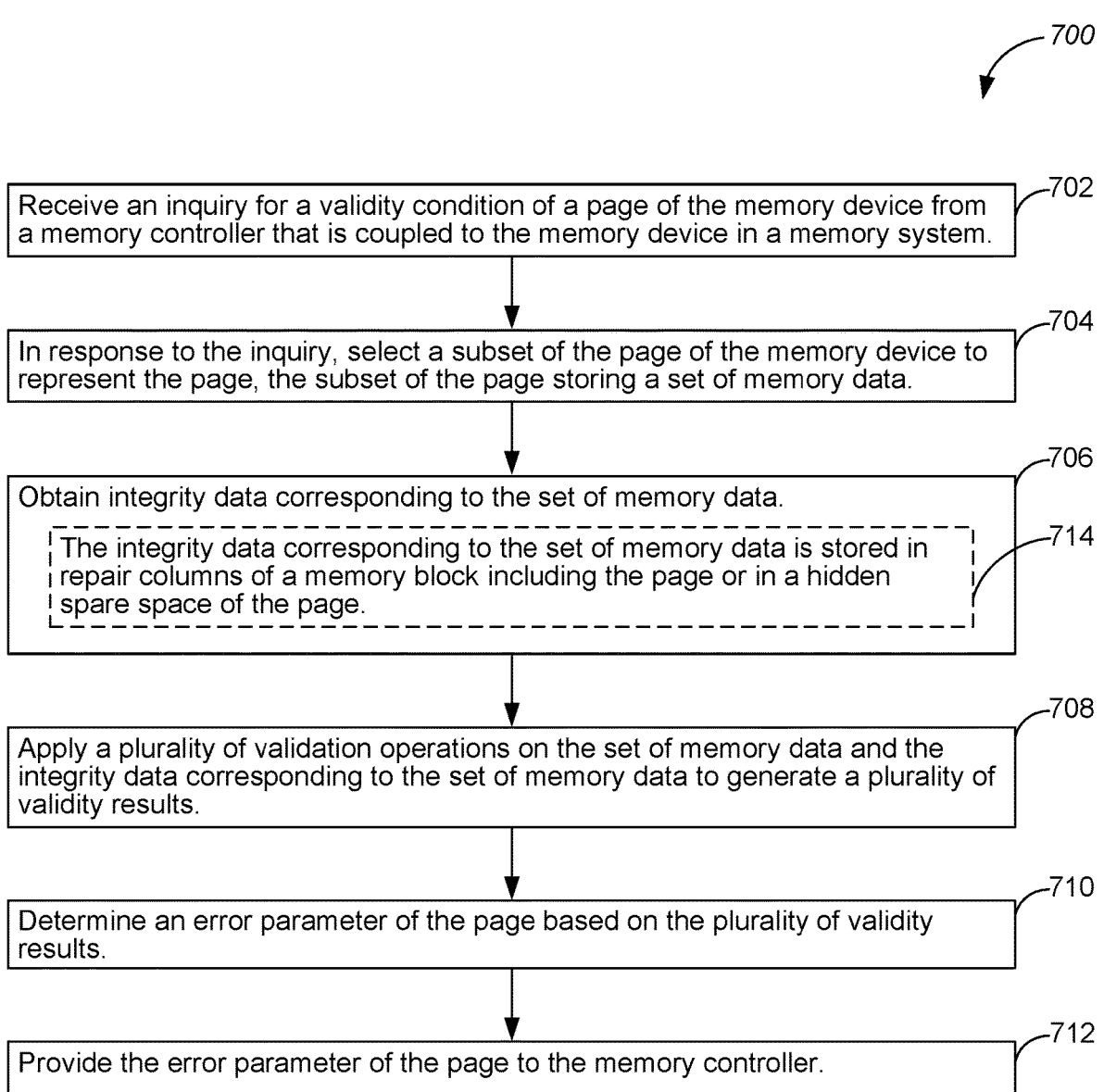

702

Receive an inquiry for a validity condition of a page of the memory device from a memory controller that is coupled to the memory device in a memory system.

704

In response to the inquiry, select a subset of the page of the memory device to represent the page, the subset of the page storing a set of memory data.

706

Obtain integrity data corresponding to the set of memory data.

714

The integrity data corresponding to the set of memory data is stored in repair columns of a memory block including the page or in a hidden spare space of the page.

708

Apply a plurality of validation operations on the set of memory data and the integrity data corresponding to the set of memory data to generate a plurality of validity results.

710

Determine an error parameter of the page based on the plurality of validity results.

712

Provide the error parameter of the page to the memory controller.

Figure 7

ERROR CONDITION MONITORING IN MEMORY SYSTEMS

TECHNICAL FIELD

This application relates generally to memory management including, but not limited to, methods, systems, and non-transitory computer-readable media for monitoring a validity condition of a page of a memory device in a memory system.

BACKGROUND

Memory is applied in a computer system to store instructions and data. The data are processed by one or more processors of the computer system according to the instructions stored in the memory. Multiple memory units are used in different portions of the computer system to serve different functions. Specifically, the computer system includes non-volatile memory that acts as secondary memory to keep data stored thereon if the computer system is decoupled from a power source. Examples of the secondary memory include, but are not limited to, hard disk drives (HDDs) and solid-state drives (SSDs). SSDs store data in NAND memory. Over time, some of the memory contents degrade and have increased numbers of bit errors. If too many bit errors accumulate, corresponding data will be uncorrectable. One way to mitigate bit error accumulation is to periodically refresh the NAND memory contents by doing read-modify-write. However, under most circumstances, the NAND memory has few errors, while periodic refreshes of the memory still uses a portion of a I/O bandwidth and a power budget of the NAND memory. Certain dynamic random access memory (DRAM) has on-chip error correction codes (ECCs) that can correct one bit errors. Refresh operations can be done internally without reading the DRAM memory contents on the I/O bus. However, the NAND memory has much higher error rates than DRAM. A more complex ECC scheme such as BCH, Reed-Solomon, or LDPC is required to correct bit errors in the NAND memory. Complex ECC encoders and decoders require a large amount of die area, causing an undesirable memory die cost. It would be beneficial to develop a fast and economical solution to monitor validity conditions of a corresponding memory system and facilitate further operations adaptively based on the validity conditions.

SUMMARY

Various embodiments of this application are directed to methods, systems, devices, non-transitory computer-readable media for monitoring a validity condition of a page of a memory device in a memory system. A new read command is added to allow a memory controller to collect an error parameter (e.g., a syndrome weight, a raw bit error rate (RBER)) of the page from the memory device without using an input/output (I/O) bus to read memory data stored in the page. A local controller is applied on a memory package, die, or plane level, and includes an on-die LDPC syndrome calculator configured to detect errors in a subset of the page. The error parameter of the page provided to the memory controller is applied to facilitate further memory control operations, which are distinct from correcting bit errors. By these means, data traffic is reduced on the I/O bus coupled between the memory controller and the memory device, and power budget and communication bandwidth are conserved to enhance memory performance (e.g., memory accesses, background data reads).

In some embodiments, a probability of having uncorrectable codes in a memory device increases with an RBER of the memory device. Occurrences of uncorrectable codewords is reduced by background data reads. However, background data reads consume power and NAND I/O bandwidth. In some embodiments, a local controller is applied locally on a memory device (e.g., a memory package, die, or plane). The local controller includes a local integrity engine for encoding an integrity code and determining an error parameter. Further, in some embodiments, the local controller only samples a subset of each page (e.g., 1 KB of a 16 KB page) for determining the error parameter, e.g., based on LDPC. In some situations, spare bytes are added for the LDPC parity. These spare bytes are optionally stored in repair columns of a memory block including the page.

Example use cases include, but are not limited to, applying an error parameter to control a background data read, read reference voltage adjustment, and internal data migration. During a background data read, an NAND command is issued to read internally and return the error parameter. In accordance with a determination that an error parameter of a page is lower than a threshold error level, the memory controller determines the page is generally correct and does not read the page over a NAND I/O bus to save power and I/O bandwidth. In accordance with a determination that an error parameter of a page is greater than the threshold error level, the memory controller reads the page, corrects errors in the page, and writes a corrected copy to another page of the memory device over the NAND I/O bus. Alternatively, based on the error parameter, the memory controller adjusts one or more on-die read reference voltages to reduce the error parameter of each respective page. Alternatively and additionally, a single-level cell (SLC) NAND memory flash is sometimes used to store data temporarily. If the RBER is low enough, an internal data move is used to write to a triple-level cell (TLC), quad-level cell (QLC), or penta-level cell (PLC) NAND flash memory flash without using the NAND I/O bus.

In one aspect, a method is implemented at an electronic device to monitoring a validity condition of a page of a memory device in a memory system (e.g., solid-state drives). The method includes receiving an inquiry for a validity condition of a page of the memory device from a memory controller that is coupled to the memory device in a memory system. The method further includes in response to the inquiry, selecting a subset of the page of the memory device to represent the page, the subset of the page storing a set of memory data. The method further includes obtaining integrity data corresponding to the set of memory data, applying a plurality of validation operations on the set of memory data and the integrity data corresponding to the set of memory data to generate a plurality of validity results, and determining an error parameter of the page based on the plurality of validity results. The method further includes providing the error parameter of the page to the memory controller. In some embodiments, the integrity data corresponding to the set of memory data is stored in repair columns of a memory block including the page. Alternatively, in some embodiments, the integrity data corresponding to the set of memory data is stored in a hidden spare space of the page.

Some implementations of this application include an electronic device that includes one or more processors and memory having instructions stored thereon, which when executed by the one or more processors cause the processors to perform any of the above methods on a memory system (e.g., solid-state drives).

Some implementations include a non-transitory computer readable storage medium storing one or more programs. The one or more programs include instructions, which when executed by one or more processors cause the processors to implement any of the above methods on a memory system (e.g., solid-state drives).

These illustrative embodiments and implementations are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

FIG. 7 is a flow diagram of an example method for monitoring a validity condition of a memory device in an electronic device, in accordance with some embodiments.

Like reference numerals refer to corresponding parts throughout the several views of the drawings.

DETAILED DESCRIPTION

Reference will now be made in detail to specific embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. For example, it will be apparent to one of ordinary skill in the art that the subject matter presented herein can be implemented on many types of electronic devices using secondary storage.

Various embodiments of this application are directed to methods, systems, devices, non-transitory computer-readable media for monitoring a validity condition of a page of a memory device in a memory system. A new read command is added to allow a memory controller to collect an error parameter (e.g., a syndrome weight, an RBER) of the page from the memory device without using an I/O bus to read memory data stored in the page. A local controller is applied on a memory package, die, or plane level, and includes an on-die LDPC syndrome calculator configured to detect errors in a subset of the page. The error parameter of the page provided to the memory controller is applied to facilitate further memory control operations, which are distinct from correcting bit errors. Examples of the further memory control operations include, but are not limited to, applying an error parameter to control a background data read, read reference voltage adjustment, and internal data migration. By these means, data traffic is reduced on the I/O bus coupled between the memory controller and the memory device, and power budget and communication bandwidth are conserved to enhance memory performance (e.g., memory accesses, background data reads).

Figure 1:
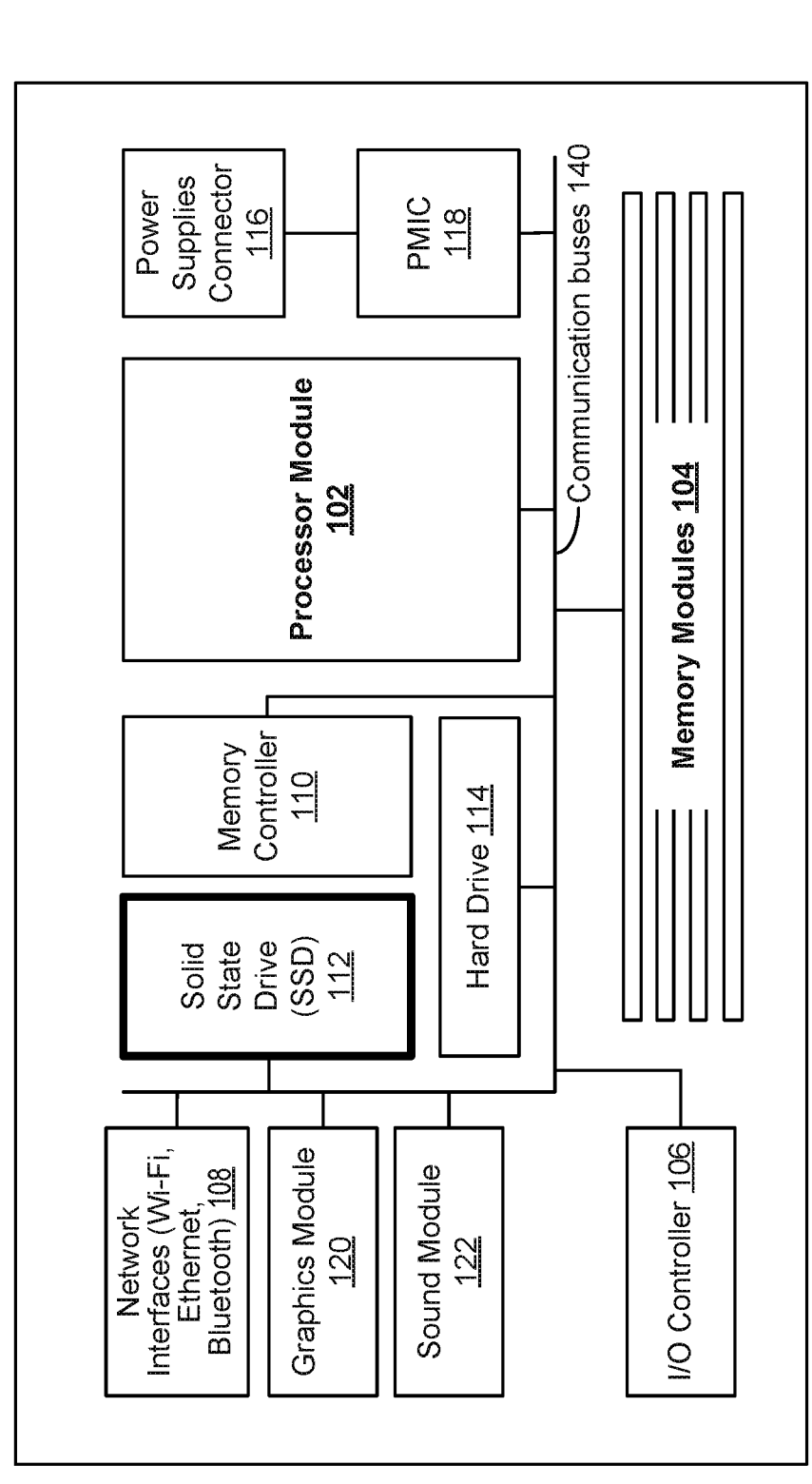
FIG. 1 is a block diagram of an example system module in a typical electronic device in accordance with some embodiments.

FIG. 1 is a block diagram of an example system module 100 in a typical electronic device in accordance with some embodiments. The system module 100 in this electronic device includes at least a processor module 102, memory modules 104 for storing programs, instructions and data, an input/output (I/O) controller 106, one or more communication interfaces such as network interfaces 108, and one or more communication buses 140 for interconnecting these components. In some embodiments, the I/O controller 106 allows the processor module 102 to communicate with an I/O device (e.g., a keyboard, a mouse or a trackpad) via a universal serial bus interface. In some embodiments, the network interfaces 108 includes one or more interfaces for Wi-Fi, Ethernet and Bluetooth networks, each allowing the electronic device to exchange data with an external source, e.g., a server or another electronic device. In some embodiments, the communication buses 140 include circuitry (sometimes called a chipset) that interconnects and controls communications among various system components included in system module 100.

In some embodiments, the memory modules 104 include high-speed random-access memory, such as static random-access memory (SRAM), double data rate (DDR) dynamic random-access memory (DRAM), or other random-access solid state memory devices. In some embodiments, the memory modules 104 include non-volatile memory, such as one or more magnetic disk storage devices, optical disk storage devices, flash memory devices, or other non-volatile solid state storage devices. In some embodiments, the memory modules 104, or alternatively the non-volatile memory device(s) within the memory modules 104, include a non-transitory computer readable storage medium. In some embodiments, memory slots are reserved on the system module 100 for receiving the memory modules 104. Once inserted into the memory slots, the memory modules 104 are integrated into the system module 100.

In some embodiments, the system module 100 further includes one or more components selected from a memory controller 110, an SSD 112, an HDD 114, power management integrated circuit (PMIC) 118, a graphics module 120, and a sound module 122. The memory controller 110 is configured to control communication between the processor module 102 and memory components, including the memory modules 104, in the electronic device. The SSD 112 is configured to apply integrated circuit assemblies to store data in the electronic device, and in many embodiments, are based on NAND or NOR memory configurations. The HDD 114 is a conventional data storage device used for storing and retrieving digital information based on electromechanical magnetic disks. The power supply connector 116 is electrically coupled to receive an external power supply. The PMIC 118 is configured to modulate the received external power supply to other desired DC voltage levels, e.g., 5V, 3.3V or 1.8V, as required by various components or circuits (e.g., the processor module 102) within the electronic device. The graphics module 120 is configured to generate a feed of output images to one or more display devices according to their desirable image/video formats. The sound module 122 is configured to facilitate the input and output of audio signals to and from the electronic device under control of computer programs.

It is noted that communication buses 140 also interconnect and control communications among various system components including components 104-122.

Further, one skilled in the art knows that other non-transitory computer readable storage media can be used, as new data storage technologies are developed for storing information in the non-transitory computer readable storage media in the memory modules 104 and in the SSD 112. These new non-transitory computer readable storage media include, but are not limited to, those manufactured from biological materials, nanowires, carbon nanotubes and individual molecules, even though the respective data storage technologies are currently under development and yet to be commercialized.

Some implementations of this application are directed to an integrity check process implemented by a memory system (e.g., SSD 112, memory module 104, HDD 114, memory controller 110), which stores codeword symbols including integrity data, e.g., LDPC codes. The integrity check process is also called a decoding process and visualized by a Tanner graph with variable nodes and check nodes. The variable nodes correspond to the codeword symbols extracted from the memory system. Each check node correspond to a distinct set of variable nodes, and has check node data configured to identify or correct bit errors in the codeword symbols corresponding to the distinct set of variable nodes. Specifically, messages are exchanged between the variable and check nodes on the Tanner graph to update the variable node data and check node data, until the bit errors are identified and corrected in the codeword symbols.

Figure 2:
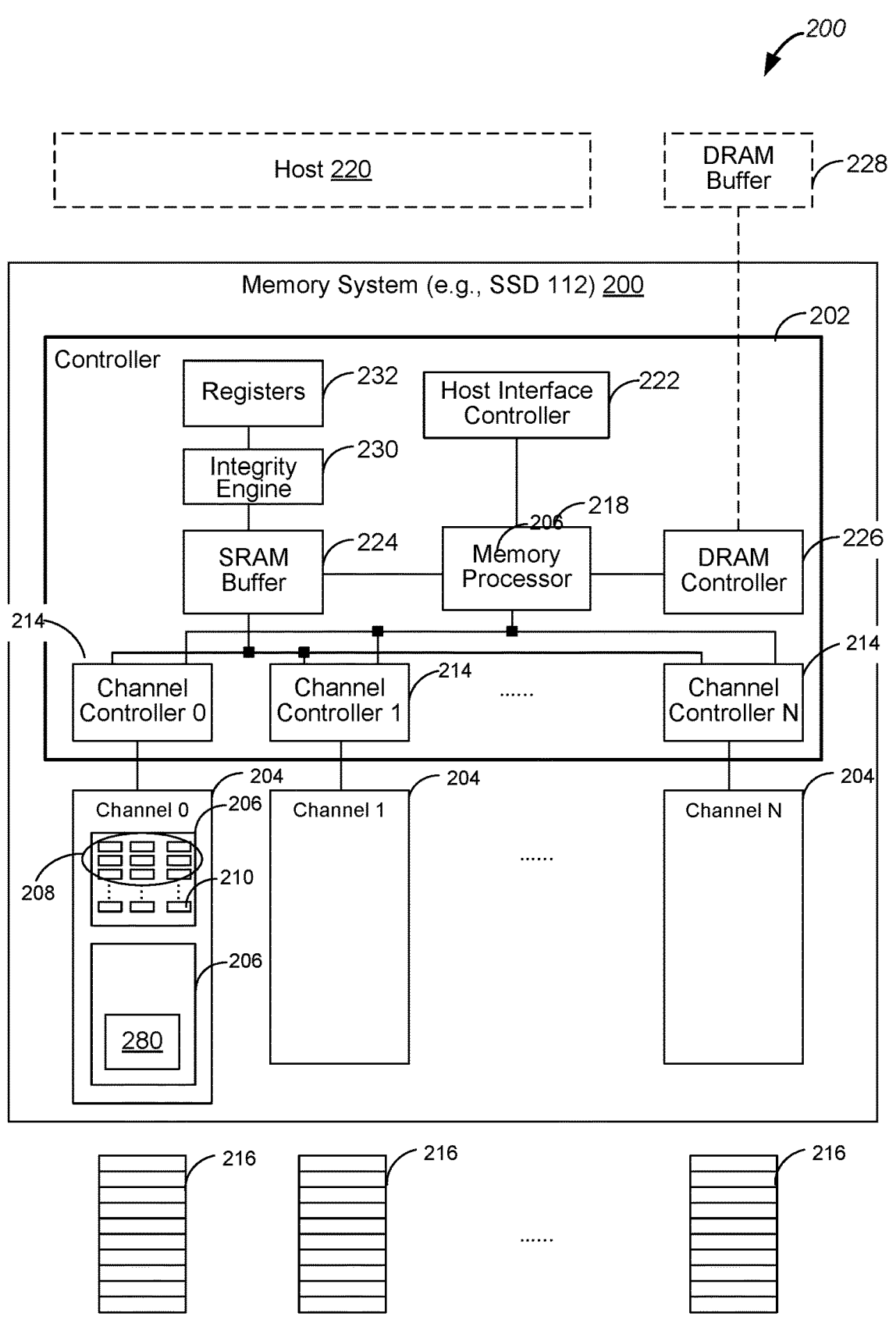
FIG. 2 is a block diagram of a memory system of an example electronic device having one or more memory access queues, in accordance with some embodiments.

FIG. 2 is a block diagram of a memory system 200 of an example electronic device having one or more memory access queues, in accordance with some embodiments. The memory system 200 is coupled to a host device 220 (e.g., a processor module 102 in FIG. 1) and configured to store instructions and data for an extended time, e.g., when the electronic device sleeps, hibernates, or is shut down. The host device 220 is configured to access the instructions and data stored in the memory system 200 and process the instructions and data to run an operating system and execute user applications. The memory system 200 further includes a controller 202 and a plurality of memory channels 204. Each memory channel 204 includes a plurality of memory cells. The controller 202 is configured to execute firmware level software to bridge the plurality of memory channels 204 to the host device 220.

Each memory channel 204 includes on one or more memory packages. In an example, each memory package includes a memory die 206. In another example, each memory package has two or more memory dies 206. Each memory package includes a plurality of memory planes 208, and each memory plane 208 further includes a plurality of memory pages 210. Each memory page 210 includes an ordered set of memory cells, and each memory cell is identified by a respective physical address. In some embodiments, the memory system 200 includes a single-level cell (SLC) NAND flash memory chip, and each memory cell stores a single data bit. In some embodiments, the memory system 200 includes a multi-level cell (MLC) NAND flash memory chip, and each memory cell stores 2 data bits. In an example, each memory cell of a triple-level cell (TLC) NAND flash memory chip stores 3 data bits. In another example, each memory cell of a quad-level cell (QLC) NAND flash memory chip stores 4 data bits. In yet another example, each memory cell of a penta-level cell (PLC) NAND flash memory chip stores 5 data bits. In some embodiments, each memory cell can store any suitable number of data bits. Compared with the non-SLC NAND flash memory chips (e.g., MLC SSD, TLC SSD, QLC SSD, PLC SSD), the SSD that has SLC NAND flash memory chips operates with a higher speed, a higher reliability, and a longer lifespan, and however, has a lower device density and a higher price.

Each memory channel 204 is coupled to a respective channel controller 214 configured to control internal and external requests to access memory cells in the respective memory channel 204. In some embodiments, each memory package (e.g., each memory die) corresponds to a respective queue 216 of memory access requests. In some embodiments, each memory channel 204 corresponds to a respective queue 216 of memory access requests. Further, in some embodiments, each memory channel 204 corresponds to a distinct and different queue 216 of memory access requests. In some embodiments, a subset (less than all) of the plurality of memory channels 204 corresponds to a distinct queue 216 of memory access requests. In some embodiments, all of the plurality of memory channels 204 of the memory system 200 corresponds to a single queue 216 of memory access requests. Each memory access request is optionally received internally from the memory system 200 to manage the respective memory channel 204 or externally from the host device 220 to write or read data stored in the respective channel 204. Specifically, each memory access request includes one of: a system write request that is received from the memory system 200 to write to the respective memory channel 204, a system read request that is received from the memory system 200 to read from the respective memory channel 204, a host write request that originates from the host device 220 to write to the respective memory channel 204, and a host read request that is received from the host device 220 to read from the respective memory channel 204. It is noted that system read requests (also called background read requests or non-host read requests) and system write requests are dispatched by a memory controller to implement internal memory management functions including, but are not limited to, garbage collection, wear levelling, read disturb mitigation, memory snapshot capturing, memory mirroring, caching, and memory sparing.

In some embodiments, in addition to the channel controllers 214, the controller 202 further includes a memory processor 218, a host interface controller 222, an SRAM buffer 224, and a DRAM controller 226. The memory processor 218 [In FIG. 2, there is an extra 206 on top of Memory Processor 218] accesses the plurality of memory channels 204 based on the one or more queues 216 of memory access requests. In some embodiments, the memory processor 218 writes into and reads from the plurality of memory channels 204 on a memory block basis. Data of one or more memory blocks are written into, or read from, the plurality of channels jointly. No data in the same memory block is written concurrently via more than one operation. Each memory block optionally corresponds to one or more memory pages. In an example, each memory block to be written or read jointly in the plurality of memory channels 204 has a size of 16 KB (e.g., one memory page). In another example, each memory block to be written or read jointly in the plurality of memory channels 204 has a size of 64 KB (e.g., four memory pages). In some embodiments, each page has 16 KB user data and 2 KB metadata. Additionally, a number of memory blocks to be accessed jointly and a size of each memory block are configurable for each of the system read, host read, system write, and host write operations.

In some embodiments, the memory processor 218 stores data to be written into, or read from, each memory block in the plurality of memory channels 204 in an SRAM buffer 224 of the controller 202. Alternatively, in some embodiments, the memory processor 218 stores data to be written into, or read from, each memory block in the plurality of memory channels 204 in a DRAM buffer 228 that is in memory system 200. Alternatively, in some embodiments, the memory processor 218 stores data to be written into, or read from, each memory block in the plurality of memory channels 204 in a DRAM buffer 228 that is main memory used by the processor module 102 (FIG. 1). The memory processor 218 of the controller 202 accesses the DRAM buffer 228 via the host interface controller 222.

Figure 3:
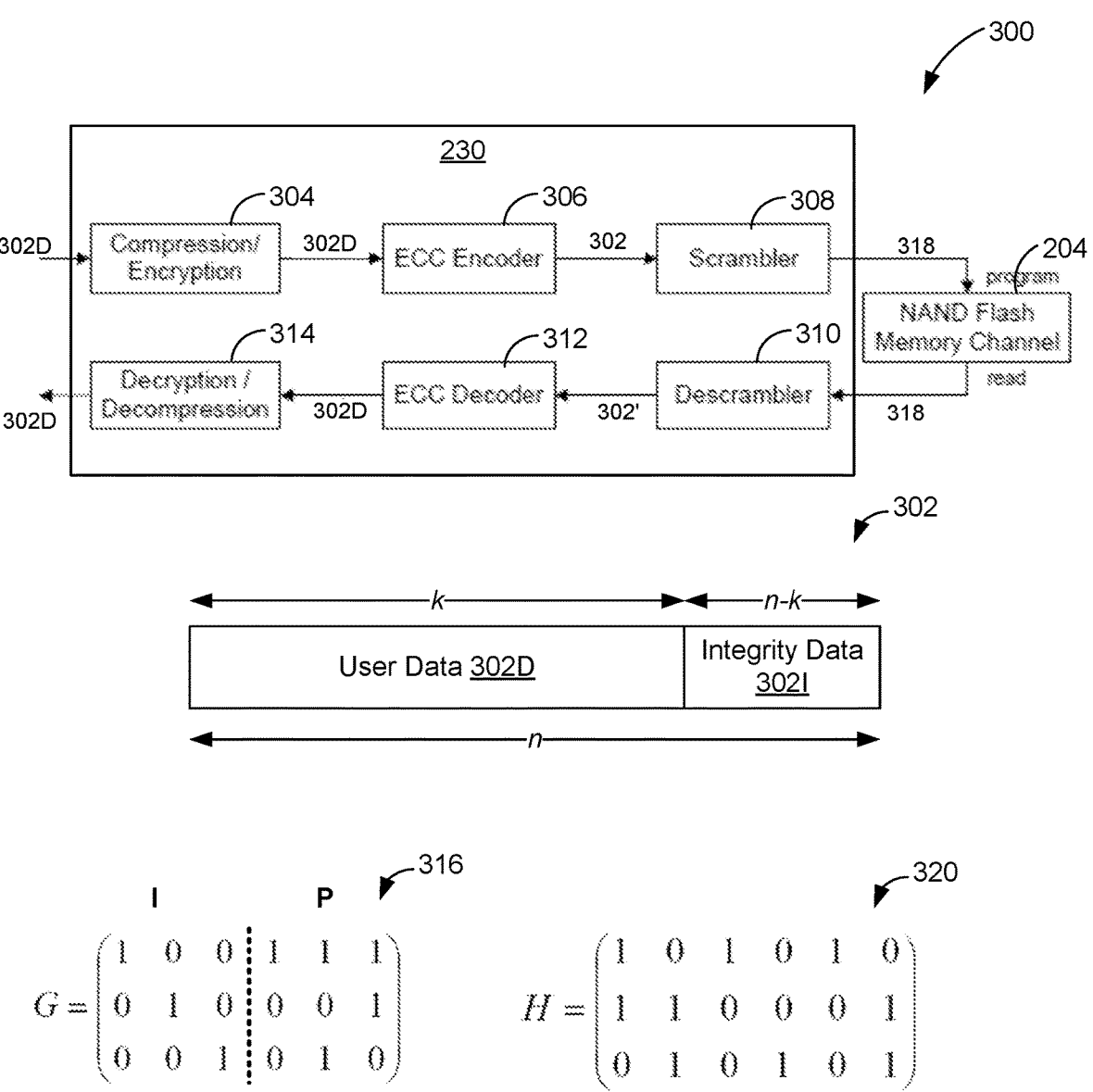
FIG. 3 is a block diagram of an example integrity check system of a memory system for processing a codeword, in accordance with some embodiments.

In some embodiments, data in the plurality of memory channels 204 is grouped into coding blocks, and each coding block is called a codeword (FIG. 3, 302). For example, each codeword includes n bits among which k bits correspond to user data and (n-k) corresponds to integrity data of the user data, where k and n are positive integers. In some embodiments, the memory system 200 includes an integrity engine 230 (e.g., an LDPC engine) and a registers 232 including a plurality of registers or SRAM cells or flip-flops and coupled to the integrity engine 230. The integrity engine 230 is coupled to the memory channels 204 via the channel controllers 214 and SRAM buffer 224. Specifically, in some embodiments, the integrity engine 230 has data path connections to the SRAM buffer 224, which is further connected to the channel controllers 214 via data paths that are controlled by the memory processor 218. The integrity engine 230 is configured to verify data integrity for each coding block of the memory channels 204 using variable nodes and check nodes, and messages are exchanged between the variable and check nodes during the integrity check process. A subset of these messages is selected and temporarily stored in the registers 232 as variable node data or check node data.

In various embodiments of this application, the memory controller 202 is coupled to a local controller 280 disposed within a memory package, a memory die 206, or a memory plane 208. A memory system 200 includes a plurality of memory packages. In at least a subset of memory packages, each respective memory package includes a local controller 280 for monitoring and reporting validity conditions of its pages. The local controller 280 is configured to receive an inquiry for a validity condition of a page of the respective memory package from the memory controller 202, verify data integrity for each codeword in a subset of the page, and determine an error parameter of the page based on validity results of the subset of the page. The error parameter of the page is determined locally within the local controller 280 and reported to the memory controller 202 via an input/output (I/O) bus. By these means, the memory controller 202 only sends the inquiry for the validity condition of the page of the memory device and receives the error parameter via the I/O bus connecting to the memory channels 204, while no memory data needs to be communicated via the I/O bus.

FIG. 3 is a block diagram of an example integrity check system 300 of a memory system 200 for processing a codeword 302, in accordance with some embodiments. The integrity check system 300 includes a plurality of memory channels 204, an integrity engine 230 (e.g., an LDPC engine), and a registers 232. Data stored in memory channels 204 of the memory system 200 (FIG. 2) is grouped into coding blocks, and each coding block is called a codeword 302. Each codeword 302 further includes n data bits among which k data bits are user data 302D and (n-k) data bits are integrity data 302I of the user data 302D, where k and n are positive integers. The integrity check system 300 is configured to verify data integrity for each codeword 302 of the memory channels 204.

In some embodiments, the integrity engine 230 further includes one or more of: a compression module 304, an error correction code (ECC) encoder 306, a scrambler 308, a descrambler 310, an ECC decoder 312, and a decompression module 314. The compression module 304 obtains user data 302D and processes (e.g., compresses, encrypts) the user data 302D. The ECC encoder 306 obtains the user data 302D that is optionally processed by the compression module 304, and applies a parity data generation matrix G (316) on the user data 302D to encode the codeword 302. The matrix G (316) has k rows and n columns. A systematic form of the matrix G includes an identify matrix I configured to preserve the user data 302D within the codeword 302 and a parity matrix P configured to generate the integrity data 302I from the user data 302D. In some embodiments, the matrix G (316) is not unique and includes a set of basis vectors for a vector space of valid codewords 302. The scrambler 308 obtains the codeword 302 including n data bits and converts the n data bits to a scrambled codeword 318 having a seemingly random output string of n data bits. The scrambled codeword 318 is stored in the memory channels 204 of the memory system 200.

During decoding, the scrambled codeword 318 is extracted from the memory channel 204 of the memory system 200. The descrambler 310 recovers a codeword 302' from the scrambled codeword 318, and the ECC decoder 312 verifies whether the recovered codeword 302' is valid and corrects erroneous bits in the recovered codeword 302, thereby providing the valid codeword 302 including the valid user data 302D. In some embodiments, the decompression module 314 obtains the user data 302D and processes (e.g., decompresses, decrypts) the user data 302D. In some embodiments, for integrity check, the ECC decoder 312 applies a parity-check matrix H (320) on the recovered codeword 302' to generate a syndrome vector S. The parity check matrix H (320) includes n-k rows corresponding to n-k parity check equations and n columns corresponding to n codeword bits. A relationship of the recovered codeword 302' and the syndrome vector s is represented as follows:

$$S = yH^T \qquad (1)$$

where y is the recovered codeword 302'. In some embodiments, in accordance with a determination that the syndrome s is equal to 0, the ECC decoder 312 determines that all parity-check equations associated with the parity-check matrix H are satisfied and that the recovered codeword 302' is valid. Conversely, in accordance with a determination that the syndrome is not equal to 0, the ECC decoder 312 determines that at least a predefined number (e.g., one, two) parity check equation associated with the parity-check matrix H is not satisfied and that the recovered codeword 302' is not valid. Alternatively, in some embodiments, the ECC decoder 312 operates to solve the following equation:

$$S = eH^T \qquad (2)$$

where e is an error vector. The syndrome vector s is a combination of the error vector e and a valid codeword 302. Given that the syndrome vector s and the parity check matrix H are known, the ECC decoder 312 solves equation (2) to obtain the error vector e and identify the erroneous bits in the recovered codeword 302'.

Figure 4:
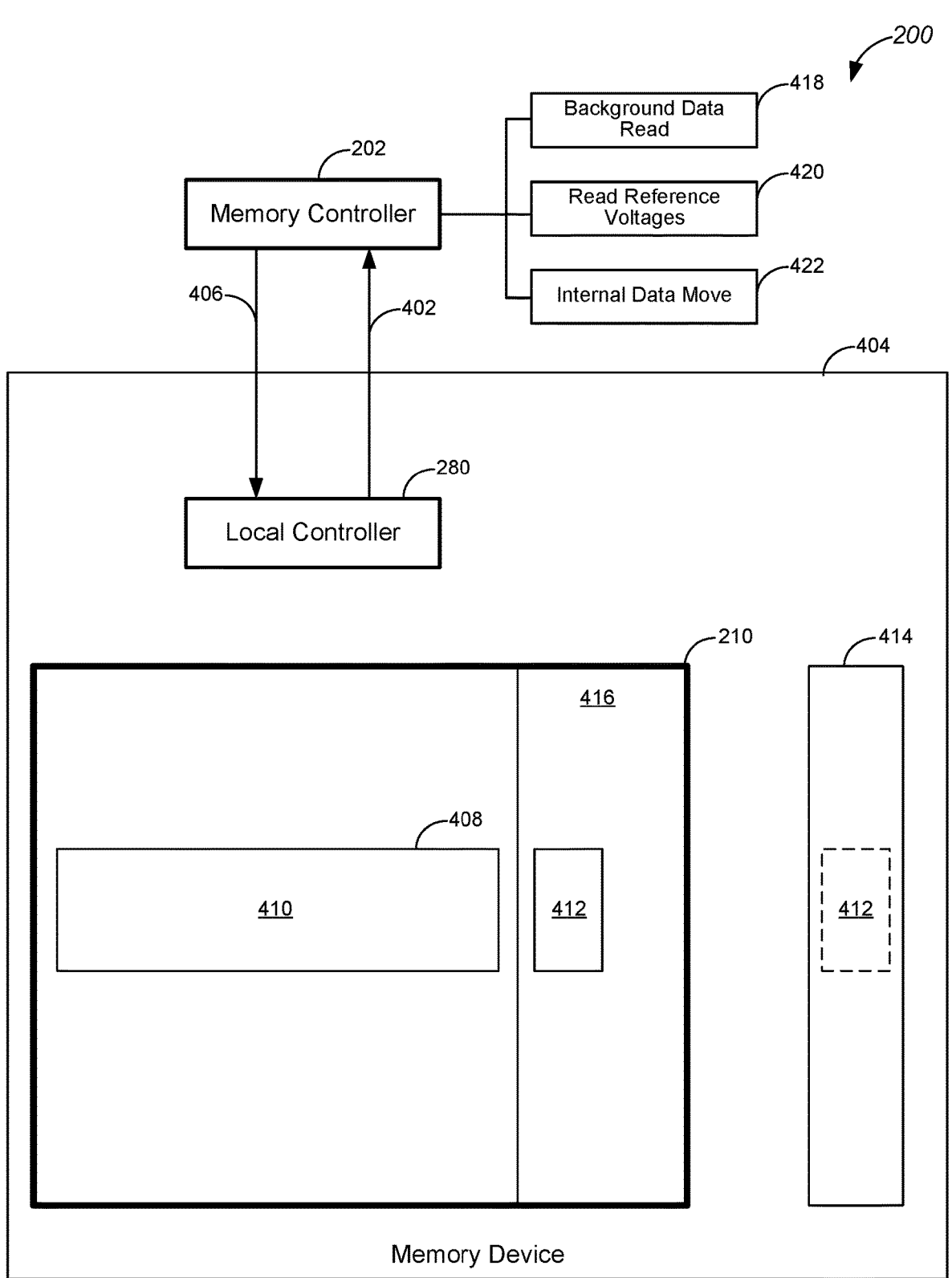
FIG. 4 is a block diagram of a memory system of another example electronic device for monitoring an error parameter of a page, in accordance with some embodiments.

FIG. 4 is a block diagram of a memory system 200 of another example electronic device for monitoring an error parameter 402 of a page 210, in accordance with some embodiments. The electronic device includes a host device 220 (e.g., one or more processors) and a memory system 200 coupled to the host device 220. The memory system 200 includes one or more memory devices 404 (e.g., a memory channel 204) and a memory controller 202. Each memory device 404 further includes a plurality of pages 210 coupled to the memory controller 202. In an example, the memory system 200 includes one or more SSDs, one of which includes a memory controller 202 and the memory device 404 coupled to the memory controller 202. The memory device 404 receives an inquiry 406 for a validity condition of the page 210 of the memory device 404 from the memory controller 202 that is coupled to the memory device 404 in the memory system 200. In some embodiments, the inquiry 406 includes an identifier (e.g., an address) of the page 210 in the memory device 404. The page 210 is identified in the memory device 404 based on the identifier of the page 210. In response to the inquiry 406, the memory device 404 selects a subset 408 of the page 210 of the memory device 404 to represent the page 210. The subset 408 of the page 210 stores a set of memory data 410. The memory device 404 obtains integrity data 412 corresponding to the set of memory data 410, and applies a plurality of validation operations on the set of memory data 410 and the integrity data 412 corresponding to the set of memory data 410 to generate a plurality of validity results. The memory device 404 further determines an error parameter 402 of the page 210 based on the plurality of validity results, and provides the error parameter 402 of the page 210 to the memory controller 202. In some embodiments, the memory device 404 includes a local controller 280 distinct from the memory controller 202 of the memory system 200, and the local controller 280 of the memory device 404 is configured to receive the inquiry 406, determines the error parameter 402 of the page 210, and provides the error parameter 402 to the memory controller 202. Examples of the error parameter 402 include, but are not limited to, a syndrome weight and an RBER.

In some embodiments, the integrity data 412 corresponding to the set of memory data 410 is stored in repair columns 414 of a memory block including the page 210. Alternatively, in some embodiments, the integrity data 412 corresponding to the set of memory data 410 is stored in a hidden spare space 416 of the page 210. Further, in some embodiments, the hidden spare space 416 of the page 210 is accessed via a command issued by the memory controller 202.

Example use cases include, but are not limited to, applying an error parameter to control a background data read 418, read reference voltage adjustment 420, and internal data migration 422. In some embodiments, during a background data read 418, the inquiry 406 is issued to read internally and return the error parameter 402. In accordance with a determination that the error parameter 402 of the page 210 is lower than a threshold error level, the memory controller determines the page is generally correct and does not read the page over a NAND I/O bus to save power and I/O bandwidth. Stated another way, in some embodiments, in accordance with a determination that the error parameter 402 of the page 210 is lower than the threshold error level, the memory controller 202 aborts reading of the page 210 via a memory I/O bus. Conversely, in accordance with a determination that the error parameter 402 of the page 210 is greater than the threshold error level, the memory controller 202 reads the page 210, corrects errors in the page 210, and writes a corrected copy to another page of the memory device 404 over the I/O bus.

Alternatively, in some embodiments, the memory controller 202 adjusts one or more on-die read reference voltages based on the error parameter 402 to reduce the error parameter 402 of each respective page 210. Alternatively and additionally, in some embodiments, an SLC NAND memory flash is sometimes used to store data temporarily. If the RBER is low enough, an internal data move is used to write to a TLC, QLC, or PLC NAND flash memory flash without using the NAND I/O bus. Stated another way, in some embodiments, in accordance with a determination that the error parameter 402 of the page 210 is lower than an error weight threshold and that the page is stored in an SLC memory portion, the memory controller 202 issues a first command to instruct the memory device 404 to write the page 210 in a non-SLC memory portion (e.g., a TLC, QLC, or PLC memory portion) without using the I/O bus between the memory controller 202 and the memory device 404.

In some embodiments, the local controller 280 is implemented on one of a memory plane 208, a memory die 206, and a memory package of the memory device 404. For example, the memory package includes the local controller 280 and one or more memory dies, and pages on the one or more memory dies are accessed by the local controller 280. In another example, the memory package includes a plurality of memory dies, and each of a subset of memory dies has a respective local controller 280. Pages on each of the subset of memory dies are accessed by the respective local controller 280. In yet another example, the memory package includes one or more memory dies, and each memory die includes a plurality of planes 208. Each of a subset of planes 208 has a respective local controller 280. Pages on each of the subset of planes 208 are accessed by the respective local controller 280.

Figure 5:
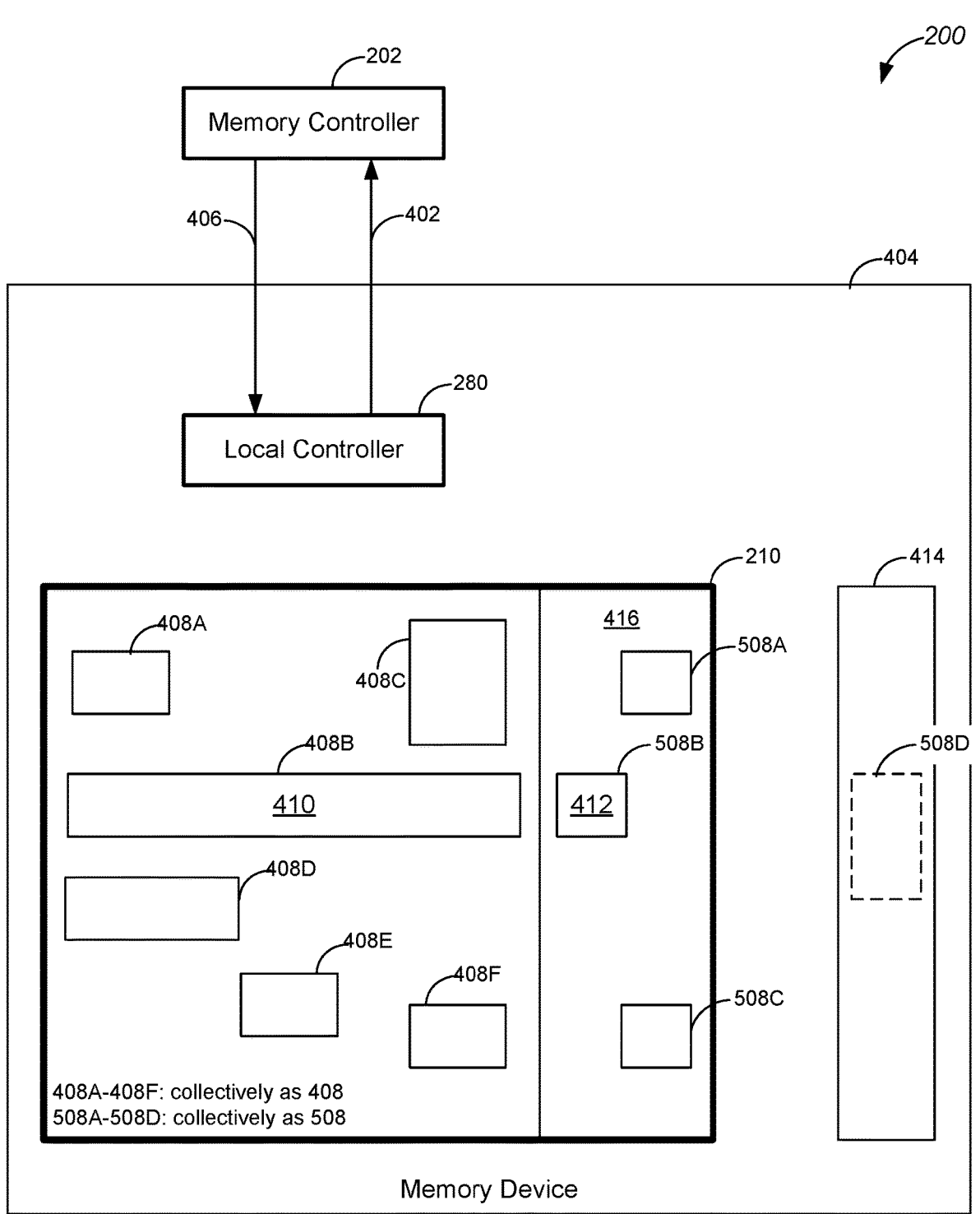
FIG. 5 is a block diagram of a memory system of another example electronic device for monitoring an error parameter of a page based on a subset of the page, in accordance with some embodiments.

FIG. 5 is a block diagram of a memory system 200 of another example electronic device for monitoring an error parameter 402 of a page 210 based on a subset 408 of the page 210, in accordance with some embodiments. The electronic device includes a host device 220 (e.g., one or more processors) and a memory system 200 coupled to the host device 220. The memory system 200 includes a memory controller 202 and one or more memory devices 404 (e.g., a memory channel 204). Each memory device 404 includes a plurality of pages 210. A memory device 404 receives an inquiry 406 for a validity condition of the page 210 of the memory device 404 from the memory controller 202. In response to the inquiry 406, the memory device 404 selects a subset 408 of the page 210 of the memory device

404 to represent the page 210. The subset 408 of the page 210 stores a set of memory data 410. The memory device 404 obtains integrity data 412 corresponding to the set of memory data 410, and applies a plurality of validation operations on the set of memory data 410 and the integrity data 412 corresponding to the set of memory data 410 to generate a plurality of validity results. The memory device 404 further determines an error parameter 402 of the page 210 based on the plurality of validity results, and provides the error parameter 402 of the page 210 to the memory controller 202. In some embodiments, the memory device 404 includes a local controller 280 configured to receive the inquiry 406 and provides the error parameter 402 to the memory controller 202.

In some embodiments, the page 210 has a memory size of 16 KB, and the selected subset 408 of the page 210 has 1 KB. In some embodiments, the subset 408 is randomly selected from the page 210. In some embodiments (e.g., FIG. 4), the subset 408 corresponds to a single region of the page. In some embodiments, the subset is less than a half of the page 210. In some embodiments, the selected subset 408 of the page 210 includes a plurality of non-contiguous regions 408A-408F of the page 210 that are distributed substantially evenly in the page. Further, in some embodiments, each of the non-contiguous regions 408A-408F stores a respective subset of the memory data 410.

In some embodiments, the integrity data 412 corresponding to the set of memory data 410 is stored in repair columns 414 of a memory block including the page 210 or a hidden spare space 416 of the page 210. Further, in some embodiments, the integrity data 412 includes a plurality of subsets of integrity data 412. In some embodiments, the repair columns 414 and/or hidden spare space 416 include a plurality of non-contiguous regions 508A-508D for storing the integrity data 412. Each of the non-contiguous regions 508A-508D stores a respective subset of the integrity data 412. In some embodiments not shown, the repair columns 414 and/or hidden spare space 416 include a single region 508 for storing the integrity data 412.

In some embodiments, the set of memory data 410 stores at least application data (e.g., program code and data used for execution of the program code), and the integrity data 412 is generated based on the set of memory data 410, independently of whether the set of memory data 410 include local integrity data for validating the application data. For example, the set of memory data 410 includes one or more codeword 302 each of which includes only user data 302D (e.g, application data), and relies on the integrity data 412 to verify its validity. Alternatively, in another example, the set of memory data 410 includes one or more codeword 302 each of which includes both user data 302D (e.g., application data) and local integrity data 302I. Stated another way, in some embodiments, the integrity data 412 includes supplemental integrity data generated based on the set of memory data 410. The set of memory data includes application data (e.g., 302D) and associated local integrity data (e.g., 302I) associated with the application data. At least one of the plurality of validation operations is configured to check a parity of a combination of a portion of the application data (e.g., 302D), a portion of local integrity data (e.g., 302I), and a portion of the supplemental integrity data 412.

In some embodiments, the error parameter 402 is determined within an error rate range that is defined by a low error rate limit L and a high error rate limit H. The subset 408 of the page has a memory size that is determined based on the low error rate limit L of the error rate range. A number X of validation operations and a size of the integrity data 412 are determined based on the high error rate limit H of the error rate range. For example, the error rate range is $10^{-3}$ (L) to $3 \times 10^{-2}$ (H). The subset 408 of the page 210 is 1 KB (i.e., 8,192 bits), and the page size is 16 KB. The subset 408 of the page 210 has 8-246 bit errors. In some embodiments, twice as many parity check equations are needed as the number of bit errors. It is unlikely for >60% of the parity check equations to fail even with a substantially high RBER. Approximately 512 parity check equations are applied with 512 parity bits, thereby creating a 64 byte overhead. Each parity check equation would check $$\frac{8192}{512} = 16 \text{ bits.}$$

In some embodiments, an XOR logic is applied to 16 bits of memory data 410 to encode one parity bit integrity data 412 during an encoding process, and the 16b memory data 410 and the 1b integrity data 412 are combined to determine a validity result (e.g., a syndrome bit). The parity check equations generate 512 syndrome bits. The local controller 280 counts the number of 1s in the syndrome to get an error parameter 402 in the range of 0-512, and provides the resulting error parameter 402 to the memory controller 202 to estimate an RBER of the entire page 210.

In various embodiments of this application, the subset 408 of the page 210 is sampled to determine a validity condition of the entire page 210. This is based on an assumption that the RBER within the same 16 KB page is expected to be substantially consistent, thereby allowing the local controller to sample the subset 408 of the page 210 and estimate the RBER of the entire page 210 based on the error parameter 402 of the subset 408 of the page 210. Given the validity is verified only on the subset 408 of the page 210, the number of parity-check equations is lower with smaller syndrome, fewer LDPC parity bits, and lower storage overhead. By these means, a number of XOR operations used for data validation is substantially reduced, so are gate count and latency of a corresponding data validity process.

Figure 6:
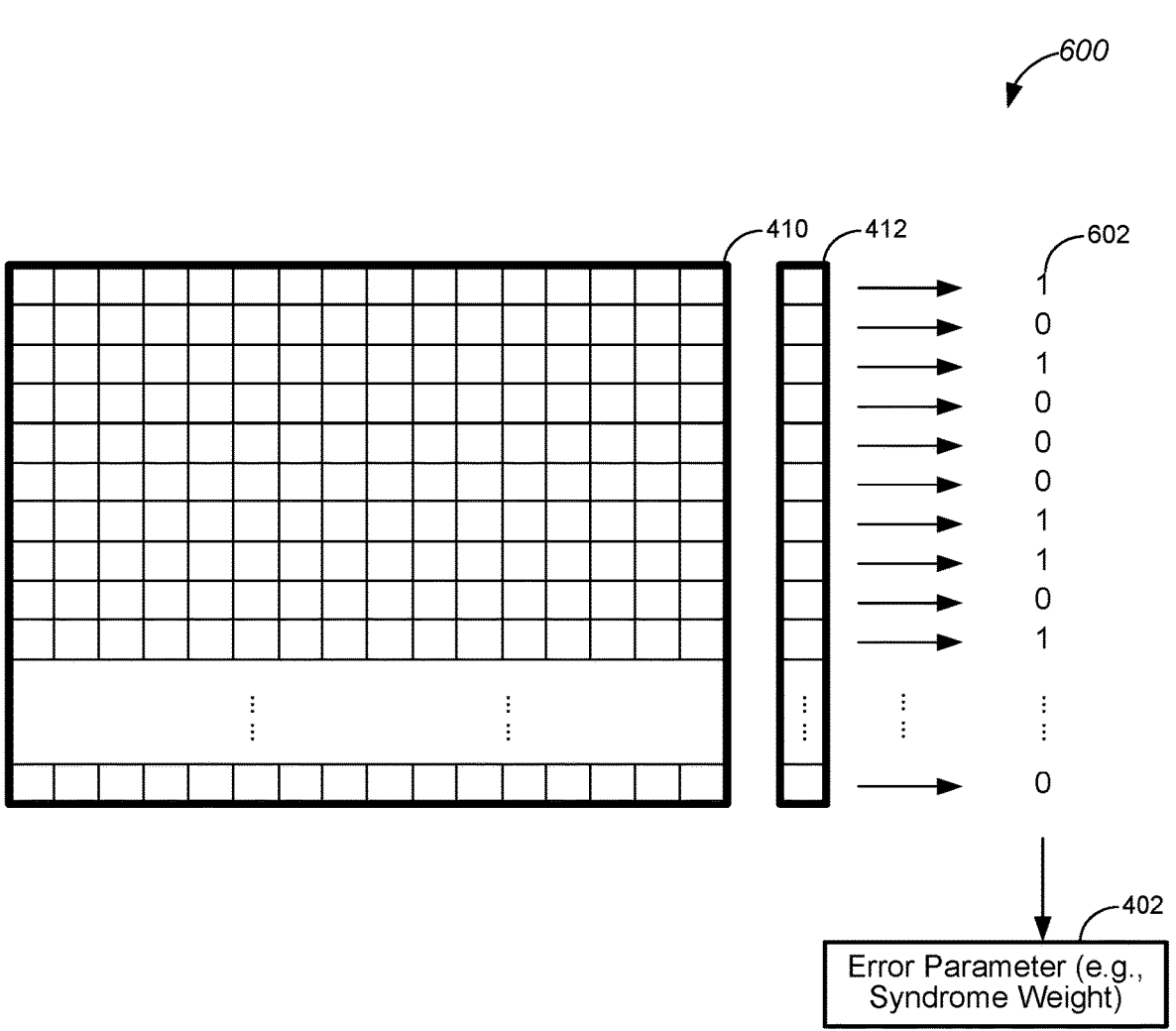
FIG. 6 is a flow diagram of an example process of determining an error parameter of a page based on a subset of the page, in accordance with some embodiments.

FIG. 6 is a flow diagram of an example process 600 of determining an error parameter 402 of a page 210 based on a subset 408 of the page 210, in accordance with some embodiments. The memory device 404 (specifically, a local controller 280 in FIGS. 4 and 5) applies a plurality of validation operations by applying each respective validation operation of the plurality of validation operations on a subset of memory data 410 and a subset of integrity data 412 associated with the subset of memory data 410 to generate a corresponding validity result 602 indicating whether the respective validation operation has succeeded. Further, in some embodiments, each validation operation includes an XOR-based parity check on the subset of memory data 410 and the subset of integrity data 412 associated with the subset of memory data 410.

In some embodiments, the respective validity result 602 is equal to a first validity result (e.g., "1") indicating that the respective validation operation has failed or a second validity result (e.g., "0") indicating that the respective validation operation has succeeded. The memory device 404 determines that the plurality of validity results include a first number of first validity results and determines the error parameter 402 based on the first number of first validity results. Additionally, in some embodiments, the error parameter 402 includes a syndrome weight, and the syndrome weight is defined as a ratio of the first number of first validity results of a total number of the plurality of validity results. In some embodiments, the local controller 280 of the memory device 404 has an on-die LDPC syndrome calculator for determining the error parameter 402.

In some embodiments, the subset 408 of the page 210 sampled to determine the error parameter 402 has a memory size (MS), e.g., 1 KB. Each validation operation includes an XOR-based parity check on N data bits (e.g., 16 bits) of the set of memory data 410 and 1 data bit of the integrity data 412. The plurality of validation operations includes M validation operations, where MS is equal to a product of N and M. No data bit of the memory data 410 and the integrity data 412 is used in more than one validation operation, and the integrity data has M bits. For example, the memory size MS is 1 KB (i.e., 8,192 bits). M and N are integers, and for example, equal to 512 and 16, respectively.

FIG. 7 is a flow diagram of an example method 700 for monitoring a validity condition of a memory device 404 in an electronic device, in accordance with some embodiments. The method 700 is implemented at the electronic device including a memory system 200, which includes a memory controller 202 and the memory device 404 (FIG. 4). In an example, the memory system 200 includes one or more SSDs, one of which includes the memory controller 202 and the memory device 404. The memory device 404 (e.g., a controller 280 of the memory device 404 in FIG. 2) receives (operation 702) an inquiry 406 for a validity condition of a page 210 of the memory device 404 from the memory controller 202 that is coupled to the memory device 404 in a memory system. In response to the inquiry 406, the memory device 404 selects (operation 704) a subset 408 of the page 210 of the memory device 404 to represent the page 210, and the subset 408 of the page 210 stores a set of memory data 410. The memory device 404 obtains (operation 706) integrity data 412 corresponding to the set of memory data 410, applies (operation 708) a plurality of validation operations on the set of memory data 410 and the integrity data 412 corresponding to the set of memory data 410 to generate a plurality of validity results 602 (FIG. 6), determines (operation 710) an error parameter 402 of the page 210 based on the plurality of validity results 602, and provides (operation 712) the error parameter 402 of the page 210 to the memory controller 202.

In some embodiments, the integrity data 412 corresponding to the set of memory data 410 is stored (operation 714) in repair columns of a memory block including the page 210 or in a hidden spare space of the page 210.

In some embodiments, the memory device 404 applies the plurality of validation operations by applying each respective validation operation of the plurality of validation operations on a subset of memory data 410 and a subset of integrity data 412 associated with the subset of memory data 410 to generate a corresponding validity result indicating whether the respective validation operation has succeeded. Further, in some embodiments, each validation operation includes an XOR-based parity check on the subset of memory data 410 and the subset of integrity data 412 associated with the subset of memory data 410.

In some embodiments, the respective validity result is equal to a first validity result indicating that the respective validation operation has failed or a second validity result indicating that the respective validation operation has succeeded. The memory device 404 determines that the plurality of validity results 602 include a first number of first validity results and determines the error parameter 402 based on the first number of first validity results. Additionally, in some embodiments, the error parameter 402 includes a syndrome weight, and the syndrome weight is defined as a ratio of the first number of first validity results of a total number of the plurality of validity results 602.

In some embodiments, the subset 408 of the page 210 has a memory size (MS). Each validation operation includes an XOR-based parity check on N data bits of the set of memory data 410 and 1 data bit of the integrity data 412. The plurality of validation operations includes M validation operations, where MS is equal to a product of N and M. No data bit of the memory data 410 and the integrity data 412 being used in more than one validation operation, and the integrity data 412 has M bits. For example, the memory size MS is 1 KB (i.e., 8,192 bits). M and N are integers, and for example, equal to 512 and 16, respectively.

In some embodiments, in accordance with a determination that the error parameter 402 of the page 210 is lower than a threshold error level, the memory controller 202 aborts reading of the page 210 via a memory I/O bus. In some embodiments, in accordance with a determination that the error parameter 402 of the page 210 is greater than the threshold error level, the memory controller 202 reads the page 210 via the memory I/O bus, corrects errors, and writes a corrected copy back to the memory device 404 via the memory I/O bus. In some embodiments, based on the error parameter 402, the memory controller 202 adjusts one or more on-die read reference voltages. In some embodiments, in accordance with a determination that the error parameter 402 of the page 210 is lower than an error weight threshold and that the page 210 is stored in an SLC memory portion, the memory controller 202 issues a first command to instruct the memory device 404 to write the page 210 in a non-SLC memory portion.

In some embodiments, the error parameter 402 is determined within an error rate range that is defined by a low error rate limit and a high error rate limit. The subset 408 of the page 210 has a memory size that is determined based on the low error rate limit of the error rate range. A number of validation operations and a size of the integrity data 412 are determined based on the high error rate limit of the error rate range.

In some embodiments, the set of memory data 410 stores at least application data, and the integrity data 412 is generated based on the set of memory data 410, independently of whether the set of memory data 410 include local integrity data 412 for validating the application data.

In some embodiments, the integrity data 412 includes supplemental integrity data generated based on the set of memory data 410. The set of memory data 410 includes application data (e.g., 302D) and associated local integrity data (e.g., 302I) associated with the application data. At least one of the plurality of validation operations is configured to check a parity of a combination of a portion of the application data, a portion of local integrity data, and a portion of the supplemental integrity data.

In some embodiments, the inquiry 406 includes an identifier of the page 210 in the memory device 404. The page 210 is identified in the memory device 404 based on the identifier of the page 210.

In some embodiments, the page 210 has a memory size of 16 KB, and the subset 408 of the page 210 has 1 KB. In some embodiments, the subset is randomly selected from the page 210. In some embodiments, the subset corresponds to a single region of the page 210. In some embodiments, the subset is less than a half of the page 210.

In some embodiments, the subset 408 of the page 210 includes a plurality of non-contiguous regions of the page 210 that are distributed substantially evenly in the page 210.

In some embodiments, the method is implemented on one of a memory plane, a memory die, and a memory package of the memory device 404, and does not communicate the memory data 410 via an I/O bus coupled between the memory device 404 and the memory controller 202.

In various embodiments of this application, an integrity check system 300 includes a plurality of memory channels 204, an integrity engine 230 (e.g., an LDPC engine), and a registers 232. Specifically, data stored in memory channels 204 of the memory system 200 (FIG. 2) is grouped into coding blocks, and each coding block is called a codeword 302. Each codeword 302 further includes n data bits among which k data bits are user data 302D and (n-k) data bits are integrity data 302I of the user data 302D, where k and n are positive integers. In some embodiments, each memory channel 204 includes a plurality of NAND memory cells. The integrity check system 300 is configured to verify data integrity for each codeword 302 of the memory channels 204. In at least a subset of memory packages 206, and each respective memory package includes a local controller 280 (FIG. 2) for monitoring and reporting its own validity condition. The local controller 280 is configured to verify data integrity for each codeword 302 in a subset of a page 210 of the respective memory package, and determines an error parameter 402 of the page 210 based on validity results 602 of the subset 408 of the page 210. By these means, the memory controller 202 only sends an inquiry 406 for a validity condition of the page 210 of the memory device 404 and receives the error parameter 402 via an NAND I/O bus connecting to the NAND based memory channels 204, while no memory data 410 needs to be communicated via the NAND I/O bus.

In some embodiments, the memory controller 202 is configured to compare the returned error parameter 402 with an error parameter calculated by reading a corresponding full NAND page 210, and determine which bits affect the error parameter 402. Further, in some embodiments, not all of the bits in the page 210 affect the error parameter 402. Alternatively, in some embodiments, only a subset 408 of the page 210 of the memory device 404 is sampled to determine the error parameter 402 of the page 210.

In some embodiments, NAND component specification of a memory system 200 describes a special read command that only reads an error parameter 402 of a page 210, and includes a predefined formula applied to convert the error parameter 402 of the page 210 to a raw bit error rate (RBER) of the page 210. The RBER indicates a fraction of bits that contain incorrect data before applying ECC. In some situations, a range of the error parameter 402 is lower than an expected number of correctable errors. Various embodiments of this application is directed to monitoring the RBER of NAND memory contents without reading the NAND memory contents via the NAND I/O bus. In an example, the error parameter 402 includes a syndrome weight, which is defined as a ratio of a number of first validity results of a total number of the plurality of validity results (FIG. 6). The controller 202 of the memory system 200 receives the syndrome weight from the memory device, and determines the RBER of the page 210 based on the syndrome weight.

Memory is also used to store instructions and data associated with the method 2000, and includes high-speed random-access memory, such as SRAM, DDR DRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory, optionally, includes one or more storage devices remotely located from one or more processing units. Memory, or alternatively the non-volatile memory within memory, includes a non-transitory computer readable storage medium. In some embodiments, memory, or the non-transitory computer readable storage medium of memory, stores the programs, modules, and data structures, or a subset or superset for implementing method 700. Alternatively, in some embodiments, the electronic device implements the method 700 at least partially based on an ASIC. The memory system 200 of the electronic device includes an SSD in a data center or a client device.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various embodiments. In some embodiments, the memory, optionally, stores a subset of the modules and data structures identified above. Furthermore, the memory, optionally, stores additional modules and data structures not described above.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

What is claimed is:

1. A method, comprising:
   receiving an inquiry for a validity condition of a page of a memory device from a memory controller that is coupled to the memory device in a memory system;
   in response to the inquiry, selecting a subset of the page of the memory device to represent the page, the subset of the page storing a set of memory data;
   extracting integrity data corresponding to the set of memory data from at least one of a repair column external to the page and a hidden spare space of the page, wherein the integrity data is based on a combination of the set of memory data and a parity matrix;
   applying a plurality of validation operations on the set of memory data and the integrity data corresponding to the set of memory data to generate a plurality of validity results;
   determining a syndrome weight of the page based on the plurality of validity results; and
   providing the syndrome weight of the page to the memory controller.

2. The method of claim 1, wherein the repair column external to the page and the hidden spare space of the page include a plurality of non-contiguous regions where the integrity data are stored.

3. The method of claim 1, wherein applying the plurality of validation operations further comprises:
   applying each respective validation operation of the plurality of validation operations on a subset of memory data and a subset of integrity data associated with the subset of memory data to generate a corresponding validity result indicating whether the respective validation operation has succeeded.

4. The method of claim 3, wherein:
   each validation operation includes an XOR-based parity check on the subset of memory data and the subset of integrity data associated with the subset of memory data.

5. The method of claim 3, wherein the respective validity result is equal to a first validity result indicating that the respective validation operation has failed or a second validity result indicating that the respective validation operation has succeeded, the method further comprising:
   determining that the plurality of validity results include a first number of first validity results; and
   determining the syndrome weight based on the first number of first validity results.

6. The method of claim 5, wherein the syndrome weight is defined as a ratio of the first number of first validity results of a total number of the plurality of validity results.

7. The method of claim 1, wherein:
   the subset of the page has a memory size (MS);

each validation operation includes an XOR-based parity check on N data bits of the set of memory data and 1 data bit of the integrity data;
   the plurality of validation operations includes M validation operations, where MS is equal to a product of N and M; and
   no data bit of the memory data and the integrity data being used in more than one validation operation, and the integrity data has M bits.

8. The method of claim 1, further comprising implementing one of the following operations at the memory controller:
   in accordance with a determination that the syndrome weight of the page is lower than a threshold syndrome level, aborting reading of the page via a memory input/output (I/O) bus; and
   in accordance with a determination that the syndrome weight of the page is greater than the threshold syndrome level, reading the page via the memory I/O bus, correcting errors, and writing a corrected copy back to the memory device via the memory I/O bus.

9. The method of claim 1, further comprising, at the memory controller:
   based on the syndrome weight, adjusting one or more on-die read reference voltages.

10. The method of claim 1, further comprising, at the memory controller:
   in accordance with a determination that the syndrome weight of the page is lower than a syndrome weight threshold and that the page is stored in an SLC memory portion, issuing a first command to instruct the memory device to write the page in a non-SLC memory portion.

11. A memory system, comprising:
   a memory controller;
   a memory device coupled to the memory controller; and
   memory storing one or more programs configured for execution by one or more processors, the one or more programs comprising instructions for:
      receiving an inquiry for a validity condition of a page of the memory device from a memory controller;
      in response to the inquiry, selecting a subset of the page of the memory device to represent the page, the subset of the page storing a set of memory data;
      extracting integrity data corresponding to the set of memory data from at least one of a repair column external to the page and a hidden spare space of the page, wherein the integrity data is based on a combination of the set of memory data and a parity matrix;
      applying a plurality of validation operations on the set of memory data and the integrity data corresponding to the set of memory data to generate a plurality of validity results;
      determining a syndrome weight of the page based on the plurality of validity results; and
      providing the syndrome weight of the page to the memory controller.

12. The memory system of claim 11, wherein the integrity data corresponding to the set of memory data is stored in repair columns of a memory block including the page or in a hidden spare space of the page.

13. The memory system of claim 11, wherein:
   the syndrome weight is determined within an error rate range that is defined by a low error rate limit and a high error rate limit;

the subset of the page has a memory size that is determined based on the low error rate limit of the error rate range; and a number of validation operations and a size of the integrity data are determined based on the high error rate limit of the error rate range.

14. The memory system of claim 11, wherein the set of memory data stores at least application data, and the integrity data is generated based on the set of memory data, independently of whether the set of memory data include local integrity data for validating the application data.

15. The memory system of claim 11, wherein:

the integrity data includes supplemental integrity data generated based on the set of memory data;

the set of memory data includes application data and associated local integrity data associated with the application data; and at least one of the plurality of validation operations is configured to check a parity of a combination of a portion of the application data, a portion of local integrity data, and a portion of the supplemental integrity data.

16. A non-transitory computer-readable storage medium storing one or more programs to be executed by one or more processors, the one or more programs comprising instructions for:

receiving an inquiry for a validity condition of a page of a memory device from a memory controller that is coupled to the memory device in a memory system;

in response to the inquiry, selecting a subset of the page of the memory device to represent the page, the subset of the page storing a set of memory data;

extracting integrity data corresponding to the set of memory data from at least one of a repair column external to the page and a hidden spare space of the page, wherein the integrity data is based on a combination of the set of memory data and a parity matrix;

applying a plurality of validation operations on the set of memory data and the integrity data corresponding to the set of memory data to generate a plurality of validity results;

determining a syndrome weight of the page based on the plurality of validity results; and providing the syndrome weight of the page to the memory controller.

17. The non-transitory computer-readable storage medium of claim 16, wherein the inquiry includes an identifier of the page in the memory device, the one or more programs further comprising instructions for:

identifying the page in the memory device based on the identifier of the page.

18. The non-transitory computer-readable storage medium of claim 16, wherein the page has a memory size of 16 KB, and the subset of the page has 1 KB.

19. The non-transitory computer-readable storage medium of claim 16, wherein the subset of the page includes a plurality of non-contiguous regions of the page that are distributed substantially evenly in the page.

20. The non-transitory computer-readable storage medium of claim 16, wherein the one or more programs are configured to be implemented on one of a memory plane, a memory die, and a memory package of the memory device.

* * * * *